United States Patent
Morozumi (10) Patent No.: US 12,014,799 B2
(45) Date of Patent: Jun. 18, 2024

(54) SEMICONDUCTOR STORAGE DEVICE HAVING BIT LINE SELECTION CIRCUIT FORMED IN MEMORY CELL ARRAY

(71) Applicant: Winbond Electronics Corp., Taichung (TW)

(72) Inventor: Naohito Morozumi, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 169 days.

(21) Appl. No.: 17/842,766

(22) Filed: Jun. 16, 2022

(65) Prior Publication Data
US 2022/0406349 A1 Dec. 22, 2022

(30) Foreign Application Priority Data
Jun. 18, 2021 (JP) .................................. 2021-101306

(51) Int. Cl.
G11C 16/04 (2006.01)
G11C 7/10 (2006.01)
G11C 7/12 (2006.01)
G11C 7/18 (2006.01)

(52) U.S. Cl.
CPC .............. *G11C 7/18* (2013.01); *G11C 7/1039* (2013.01); *G11C 7/12* (2013.01)

(58) Field of Classification Search
CPC ........... G11C 7/18; G11C 7/1039; G11C 7/12; G11C 16/26; G11C 16/0483; G11C 16/10; G11C 16/24; H10B 41/40; H10B 43/40; H10B 41/35

USPC ..................................................... 365/185.03
See application file for complete search history.

(56) References Cited

U.S. PATENT DOCUMENTS

| | | | | |
|---|---|---|---|---|
| 6,469,955 B1 * | 10/2002 | Tsao | ..................... | G11C 7/1042 365/189.05 |
| 6,704,239 B2 * | 3/2004 | Cho | ........................ | G11C 7/12 365/185.12 |
| 7,259,985 B2 * | 8/2007 | Maejima | ................ | G11C 16/26 365/185.01 |
| 7,583,540 B2 * | 9/2009 | Park | ................... | G11C 16/0483 365/185.17 |
| 7,796,463 B2 | 9/2010 | Wang et al. | | |

FOREIGN PATENT DOCUMENTS

| | | |
|---|---|---|
| CN | 105938722 | 11/2020 |
| JP | 2013021202 | 1/2013 |
| TW | 200737192 | 10/2007 |

* cited by examiner

*Primary Examiner* — Tha-O H Bui
(74) *Attorney, Agent, or Firm* — JCIPRNET (57) ABSTRACT

The disclosure provides a semiconductor storage device that realizes high integration and improves reliability. A bit line selection circuit (100) of a flash memory includes transistors (BLSeO, BLSeE, BLSoO, BLSoE) in the column direction of bit lines (BL0-BL3), selecting a bit line pair composed of an even-numbered bit line (BL0) and an odd-numbered bit line (BL3) is selected by the transistors, in which a bit line pair (BL1, BL2) adjacent to the selected bit line pair is set as a non-selected bit line pair, and the selected bit line pair (BL0, BL3) is connected to page buffer/sensing circuit through an output node (BLS0, BLS1).

14 Claims, 12 Drawing Sheets

FIG. 4A (related art)
cross section along line A-A

FIG. 4B (related art)
cross section along line B-B

SEMICONDUCTOR STORAGE DEVICE HAVING BIT LINE SELECTION CIRCUIT FORMED IN MEMORY CELL ARRAY

CROSS-REFERENCE TO RELATED APPLICATION

This application claims the priority benefit of Japan application serial no. 2021-101306, filed on Jun. 18, 2021. The entirety of the above-mentioned patent application is hereby incorporated by reference herein and made a part of this specification.

BACKGROUND

Technical Field

The disclosure relates to a semiconductor storage device, in particular to a bit line selection method of an NAND flash memory.

Description of Related Art

In a NAND flash memory, when the pages are read or programmed, one word line is divided into an even-numbered page and an odd-numbered page to be operated in order to suppress noise generated by capacitive coupling between bit lines. For example, when the even-numbered page is read, the odd-numbered page is grounded; and when the when the odd-numbered page is read, the even-numbered page is grounded. Moreover, when the even-numbered pages is programmed, the odd-numbered pages is set to be disabled from programming; and when the odd-numbered page is programmed, the even-numbered page is set to be disable from programming (Japanese Patent Laid-Open No. 2013-021202, for example).

Figure 1:
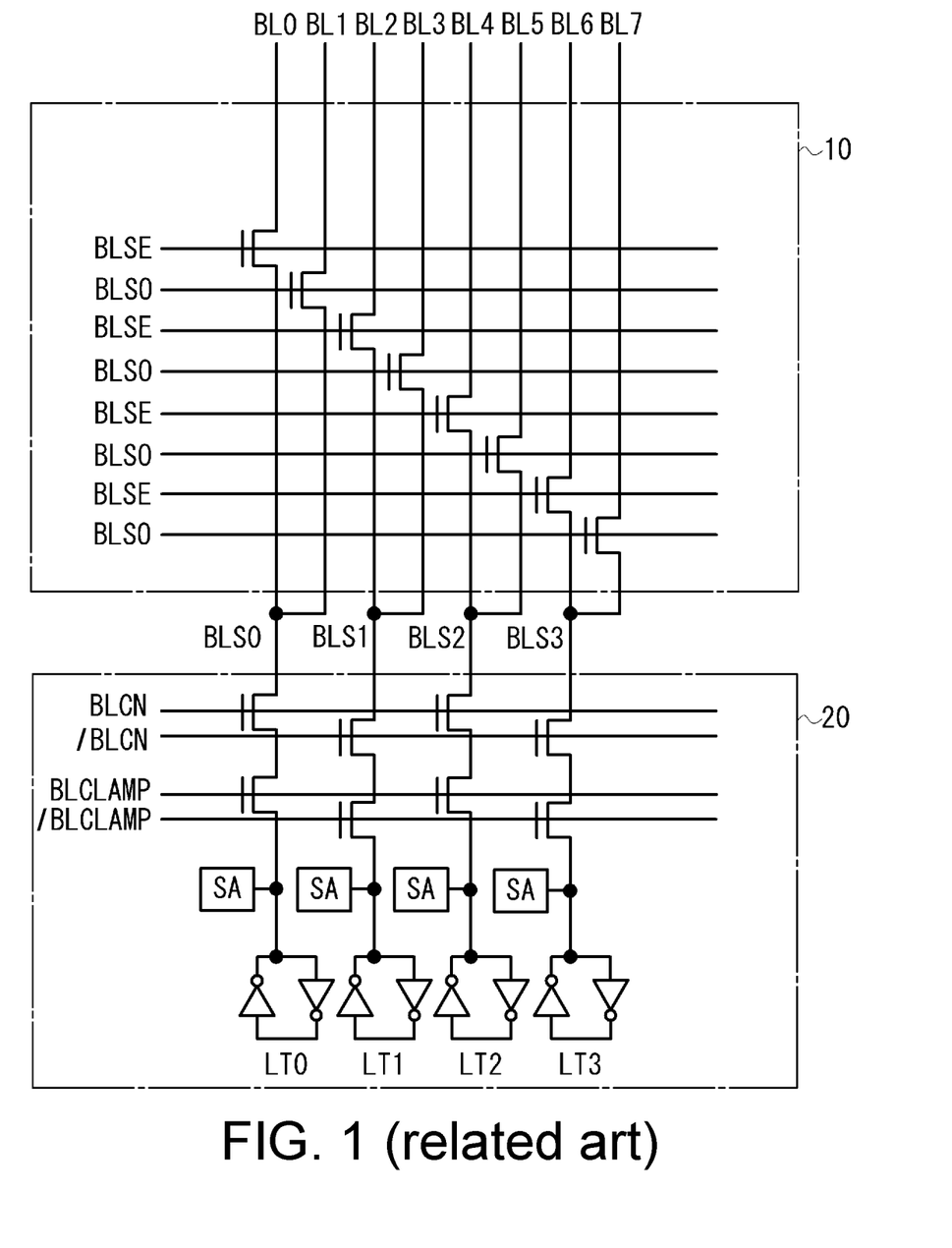
FIG. 1 is a diagram illustrating a page buffer/sensing circuit and a bit line selection circuit of a conventional NAND flash memory.

FIG. 1 illustrates the connection relationship between the page buffer/sensing circuit and the bit line selection circuit of a conventional NAND flash memory. Eight NAND strings (not shown) of the memory cell array are respectively connected to bit lines BL0, BL1 . . . BL7 (eight bit lines are depicted here as an example), and these bit lines are connected to a page buffer/sensing circuit 20 via a bit line selection circuit 10. The bit lines BL0, BL2, BL4, and BL6 are even-numbered bit lines, and the bit lines BL1, BL3, BL5, and BL7 are odd-numbered bit lines. One word line of the memory cell array includes two pages, i.e. the even-numbered page and the odd-numbered page.

The bit line selection circuit 10 is connected to the page buffer/sensing circuit 20 via nodes BLS0, BLS1, BLS2, and BLS3. A pair of adjacent even-numbered bit line and odd-numbered bit line shares one of these nodes BLS0, BLS1, BLS2, and BLS3. The bit line selection circuit 10 includes transistors for selecting even-numbered bit lines and transistors for selecting odd-numbered bit lines. Each gate of the transistors for selecting the even-numbered bit lines is connected to a selection gate line BLSE, and each gate of the transistors for selecting the odd-numbered bit lines is connected to the selection gate line BLSO. For convenience, the transistor connected to the selection gate line BLSE is referred to as a transistor BLSE, and the transistor connected to the selection gate line BLSO is referred to as a transistor BLSO. Moreover, although not shown in FIG. 1, the bit line selection circuit 10 may include transistors for connecting the non-selected bit lines to a virtual power supply VIRPWR (ground potential GND during a read operation).

The page buffer/sensing circuit 20 includes a plurality of transistors respectively connected to gate lines BLCN for switching the connection or non-connection to a pair of bit lines, /BLCN; a plurality of transistors respectively connected to gate lines BLCLAMP and /BLCLAMP for generating clamp voltages at bit lines; a plurality of sensing amplifiers SA; and latches LT0, LT1, LT2, and LT3 respectively holding data sensed by these sensing amplifiers SA, so as to alternately perform the sensing of the even-numbered bit lines and the sensing of the odd-numbered bit lines.

With the high integration of flash memory, miniaturization of the bit line selection circuit has become one of the important issues. By forming the bit line selection circuit in the memory cell array, the bit line selection circuit can be miniaturized, but the effect of floating gate (FG) coupling between memory cells or coupling between bit lines cannot be avoided by the conventional way of alternating the sensing of even-numbered and odd-numbered bit lines as in the past.

SUMMARY

The disclosure provides a semiconductor storage device that solves such a conventional problem, realizes high integration, and improves reliability.

The semiconductor storage device of the disclosure includes: a memory cell array including a plurality of NAND strings and a bit line selection circuit, the plurality of NAND strings respectively connected to a plurality of bit lines; and a page buffer/sensing circuit connected to the bit line selection circuit, in which the bit line selection circuit is configured to select a bit line pair composed of an even-numbered bit line and an odd-numbered bit line. A bit line pair adjacent to the selected bit line pair is set as a non-selected bit line pair, and the selected bit line pair is connected to the page buffer/sensing circuit via an output node of the bit line selection circuit.

According to the disclosure, the high integration of a semiconductor storage device can be realized by configuring a bit line selection circuit in a memory cell array. Further, the bit line selection circuit selects or non-selects a bit line pair composed of an even-numbered bit line and an odd-numbered bit line. One bit line of the selected bit line pair is shielded by the adjacent non-selected bit line pair, the other bit line of the selected bit line pair is shielded by the adjacent non-selected bit line pair, and two non-selected bit lines are interposed between the selected bit line pairs, thereby reducing the effect of the FG coupling of the memory cells or the coupling between the bit lines.

DESCRIPTION OF THE EMBODIMENTS

Embodiments of the disclosure will be described in detail with reference to the drawings. The semiconductor storage device of the disclosure includes a NAND flash memory or a microprocessor, a microcontroller, a logic, an application-specific integrated circuits (ASIC), a processor adapted to process images or sound, or a processor adapted to process signals such as wireless signals, etc., that is embedded in such a flash memory. Furthermore, note that the components are shown by emphasis to facilitate understanding of the disclosure, and may not be drawn to scale.

Next, embodiments of the disclosure will be described in detail. According to the NAND flash memory of this embodiment, to realize the miniaturization of a bit line selection circuit, the bit line selection circuit is formed in a memory cell array, and the pitch of the bit lines or the pitch of the active area of the bit line selection circuit is the same as that of the memory cell array. Furthermore, the bit line selection circuit of this embodiment adopts a bit line pair sensing method; instead of selecting either even-numbered bit lines or odd-numbered bit lines at each selection as in the past, the even-numbered bit line and the odd-numbered bit line are selected in pairs. The bit line pair adjacent to the selected bit line pair is set as non-selected, and each bit line of the selected bit line pair is shielded by the non-selected bit line pair, thereby suppressing noise during reading. On the other hand, two non-selected bit lines are interposed between the selected bit line pairs, thereby reducing the effect of the FG coupling of the memory cell and the coupling between the bit lines, so as to improve the reliability of memory operation.

Moreover, the page buffer/sensing circuit desirably adopts a current sensing method in order to further reduce the effect of coupling between bit lines. In the case where the sensing circuit is a voltage-type sensing circuit, when the potential of one bit lines is not changed and the other bit line is discharged in order to detect the discharged potential of the bit lines, the following problems may occur. Due to the capacitive coupling between the bit lines, it is difficult to discharge the potential of the other bit line, and the potential of the bit line cannot be quickly and accurately detected by the voltage-type sensing circuit. When the sensing circuit is a current-type sensing circuit, the potential of the bit line is not detected. Thus, the current-type sensing circuit is less affected by the capacitive coupling between the bit lines as compared with the voltage-type sensing circuit. A current-type sensing amplifier measures, for example, a voltage at two ends of a shunt resistor.

Figure 2:
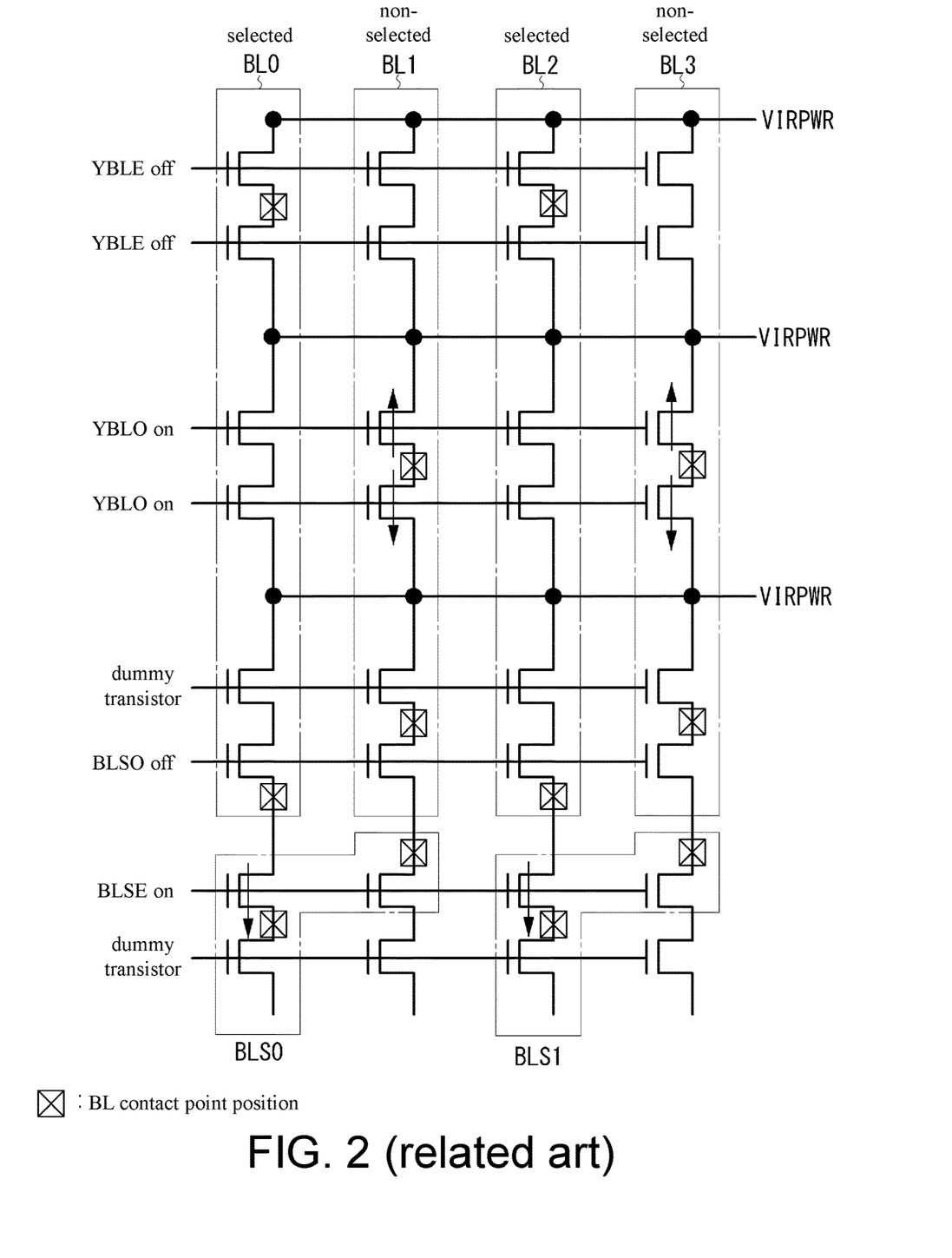
FIG. 2 is a diagram illustrating a configuration of a conventional bit line selection circuit.

FIG. 2 shows a part of a conventional bit line selection circuit for illustrating the states of the transistors thereof when the even-numbered bit lines are selected. When even-numbered bit lines BL0 and BL2 are selected, the transistors BLSE are turned on, and the transistors BLSO are turned off, such that the selected bit lines BL0 and BL2 are connected to the output nodes BLS0 and BLS1 leading to the page buffer/sensing circuit, respectively. On the other hand, the transistors YBLO are turned on and the transistors YBLE are turned off, such that odd-numbered bit lines BL1 and BL3 are connected to a virtual power supply VIRPWR (GND during read operation). In the case when the odd-numbered bit lines BL1 are BL3 are selected, the on/off of the transistors is reversed from that described above.

Figure 3:
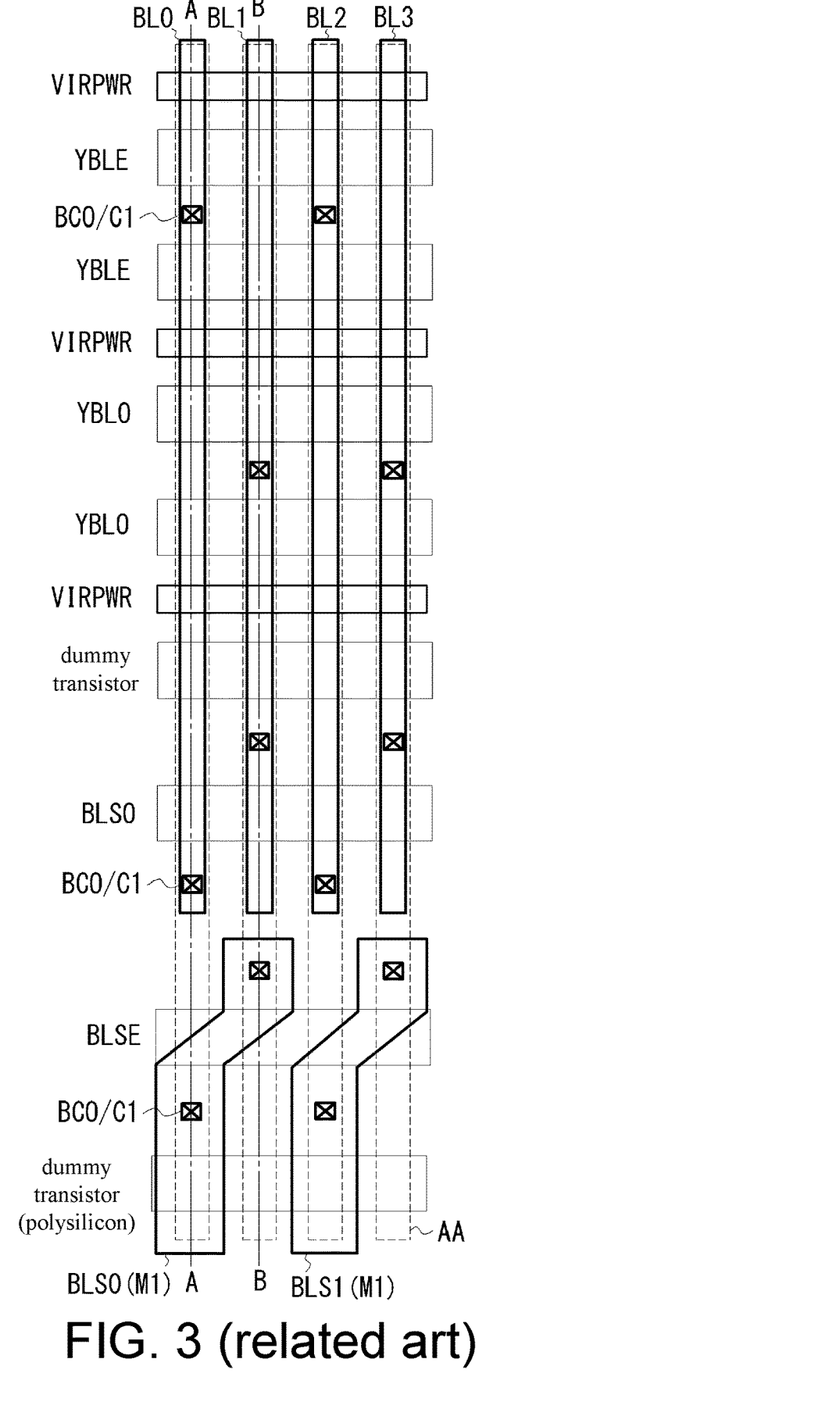
FIG. 3 is a top view of a conventional bit line selection circuit.
Figure 4A:
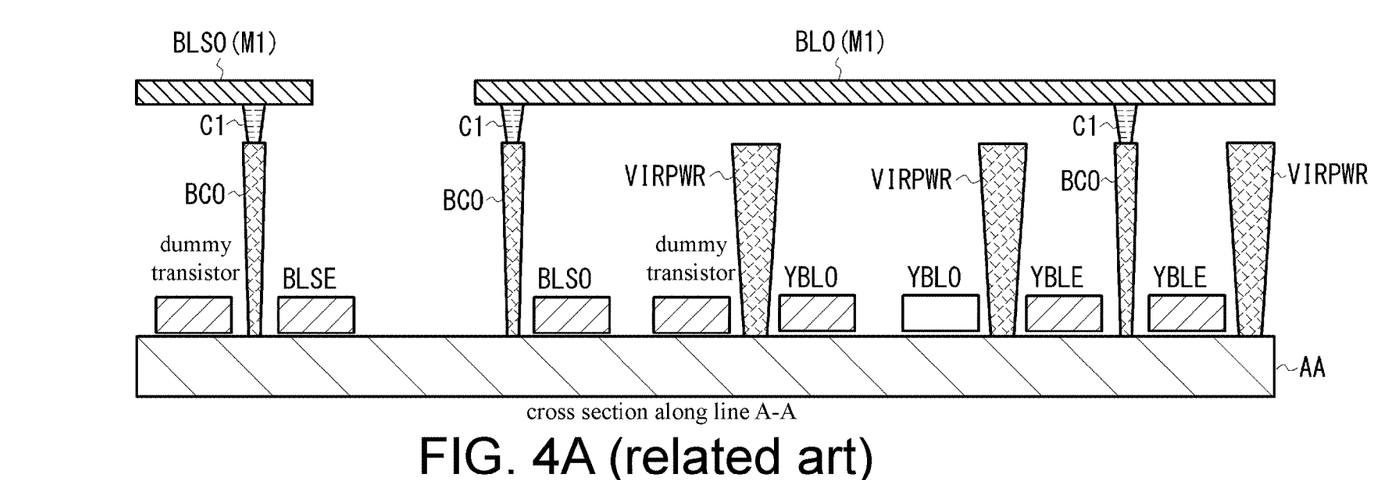
FIGS. 4A and 4B are respectively a cross-sectional diagram along line A-A and a cross-sectional diagram along line B-B of the bit line selection circuit shown in FIG. 3.
Figure 4B:
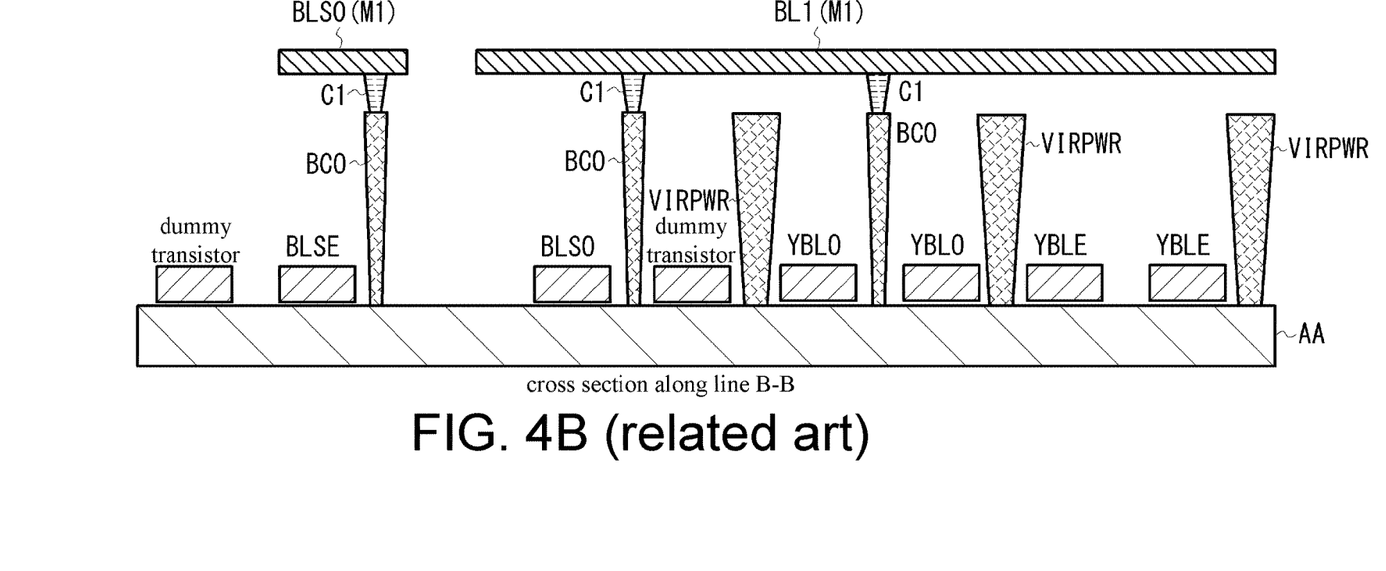

FIG. 3 is a top view of the bit line selection circuit of FIG. 2, and FIGS. 4A and 4B illustrate a cross section of line A-A and a cross section of line B-B of the bit line selection circuit of FIG. 3, respectively. The gate of each transistor (including dummy transistor) includes a polysilicon layer; the output nodes BLS0 and BLS1, and the bit line BL0 to the bit line BL3 include a metal layer M1. There is a contact point BC0 between an active area AA and a contact point C1, which is between the contact point BC0 and the bit line (for example, bit line BL0 or bit line BL1). Here, the source/drain of the active area AA is omitted.

Next, the bit line selection circuit of this embodiment will be described. In the conventional bit line selection circuit, the contact points BC0 and the contact points C1 are disposed at 2BL pitch (spacing of 2 bit lines), only the metal layer M1 is used for wiring, and either all of even-numbered bit lines or all of odd-numbered bit lines are selected at once. The configuration cannot be applied to a sensing method in which an even-numbered bit line and the adjacent odd-numbered bit line thereof are selected as a pair (i.e. a bit line pair).

In this embodiment, the bit line selection circuit is formed in the memory cell array to realize high integration of the flash memory. In the bit line selection circuit of this embodiment, two adjacent bit lines share the output node leading to the page buffer/sensing circuit, and a bit line pair composed of an even-numbered bit line and an odd-numbered bit line is selected. To select the bit line pair, in one embodiment, the contact points BC0 and the contact points C1 may be disposed with 4BL pitch (spacing of 4 bit lines). However, in order to simplify the process, in another embodiment, the contact points BC0 are disposed at 2BL pitch as in the past, and only the contact points C1 are formed at 4BL pitch. In the embodiment having the contact points BC0 formed with 2BL pitch, half of the contact points BC0 are connected between the active area and a metal layer M0 lower than the metal layer M1 directly without the need of contact points C1, so as to connect some of the active areas AA to the metal layer M0 rather than the metal layer M1. Therefore, the selection can be made with a bit line pair composed of an even-numbered bit line and an odd-numbered bit line. Moreover, the bit line selection circuit of this embodiment adopts a multi-layer wiring configuration, which includes the metal layer M0 that is lower than the metal layer M1.

Figure 5:
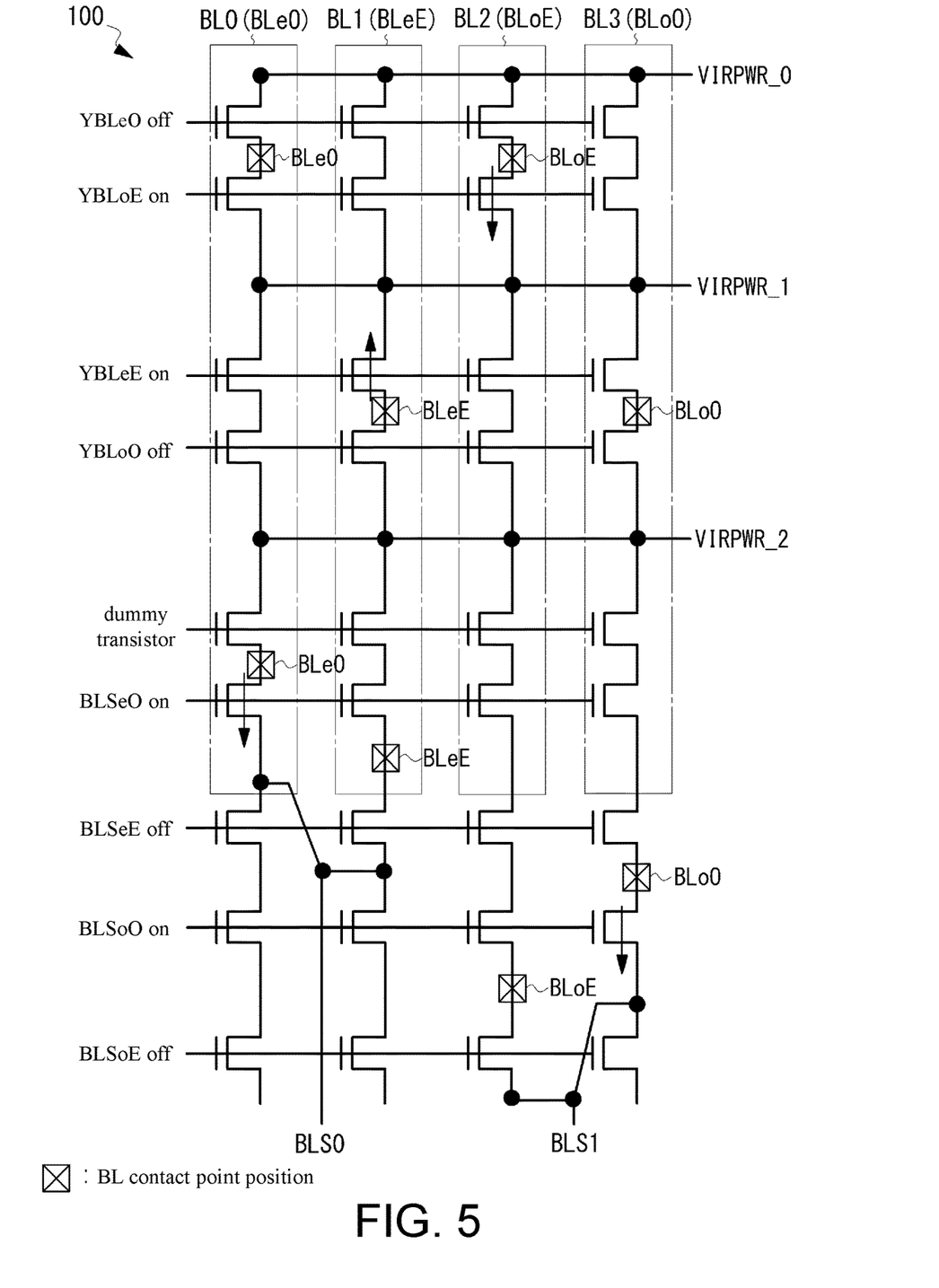
FIG. 5 is a circuit diagram of a bit line selection circuit of a NAND flash memory according to a first embodiment of the disclosure.

FIG. 5 illustrates a part of the bit line selection circuit of a first embodiment, where bit lines BL0 to BL3 are exemplified. Table 1 shows the states of each bit line when an odd-numbered group of bit line pairs is selected, and Table 2 shows the states of each bit line when an even-numbered group of bit line pairs is selected, where bit line BL0 to bit line BL7 are exemplified.

TABLE 1

| (odd-numbered groups selected) | | | | | | | |
|---|---|---|---|---|---|---|---|
| BL0 | BL1 | BL2 | BL3 | BL4 | BL5 | BL6 | BL7 |
| BLeO selected | BLeE non-selected | BLoE non-selected | BLoO selected | BLeO selected | BLeE non-selected | BLoE non-selected | BLoO selected |
| BLS0 | VIRPWR | VIRPWR | BLS1 | BLS2 | VIRPWR | VIRPWR | BLS3 |

TABLE 2

| (even-numbered groups selected) | | | | | | | |
|---|---|---|---|---|---|---|---|
| BL0 | BL1 | BL2 | BL3 | BL4 | BL5 | BL6 | BL7 |
| BLeO non-selected | BLeE selected | BLoE selected | BLoO non-selected | BLeO non-selected | BLeE selected | BLoE selected | BLoO non-selected |
| VIRPWR | BLS0 | BLS1 | VIRPWR | VIRPWR | BLS2 | BLS3 | VIRPWR |

Here, for convenience of explanation, the odd-numbered group includes the bit lines BL0, BL3, BL4 and BL7, and the even-numbered group includes the bit lines BL1, BL2, BL5 and BL6. Moreover, the bit line at the beginning, which is the bit line BL0, can be selected or non-selected individually, that is, not in pairs with other bit line for selecting or not selecting, so as to have a different selection state from the adjacent bit line. However, this is merely an example, in an alternative embodiment, the bit line BL0 and the bit line BL1 can also be set as a bit line pair to be selected or non-selected. Further, in the present embodiment, with four consecutive bit lines as a unit, the bit lines are defined as BLeO, BLeE, BLoE, and BLoO from left to right. Thus, when an odd-numbered group is selected, the bit lines defined as BLeO and BLoO are selected as the read targets, and when an even-numbered group is selected, the bit lines defined as BLeE and BLoE are selected as the read targets.

As shown in Table 1, when the odd-numbered group is selected, the bit lines BLeO and BLoO are connected to the page buffer/sensing circuit 20. In detail, the bit line BL0 is connected to the output node BLS0, the bit line BL3 is connected to the output node BLS1, the bit line BL4 is connected to the output node BLS2, and the bit line BL7 is connected to the output node BLS3. On the other hand, the non-selected bit lines BLeE and BLoE are connected to the virtual power supply VIRPWR (GND during read operation).

Similarly, as shown in Table 2, when the even-numbered group is selected, the bit lines BLeE and BLoE are connected to the page buffer/sensing circuit 20. In detail, the bit line BL1 is connected to the output node BLS0, the bit line BL2 is connected to the output node BLS1, the bit line BL5 is connected to the output node BLS2, and the bit line BL6 is connected to the output node BLS3. The non-selected bit lines BLeO and BLoO are connected to the virtual power supply VIRPWR.

As shown in FIG. 5, a bit line selection circuit 100 of this embodiment includes BLSeO transistors, BLSeE transistors, BLSoO transistors, and BLSoE transistors, for connecting either the bit line BLeO or the bit line BLeE to the output node BLS0 and connecting either the bit line BLoE or the bit line BLoO to the output node BLS1. Each of the bit lines BLeO, BLeE, BLoE, and BLoO extends in the column direction. One of the BLSeO transistors, one of the BLSeE transistors, one of the BLSoO transistors, and one of the BLSoE transistors are arranged in series along the column direction in a manner corresponding to the pitch of these bit lines. The gates of the BLSeO transistors are commonly connected to a selection gate line BLSeO extending in the row direction, the gates of the BLSeE transistors are commonly connected to a selection gate line BLSeE extending in the row direction, the gates of the BLSoO transistors are commonly connected to a selection gate line BLSoO extending in the row direction, and the gates of the BLSoE transistors are commonly connected to a selection gate line BLSoE extending in the row direction. In the present embodiment, each of the BLSeO transistors, the BLSeE transistors, the BLSoO transistors, and the BLSoE transistors is a negative channel-metal-oxide-semiconductor (NMOS) transistor.

One diffusion region of the BLSeO transistor is electrically connected to the bit line BLeO, and another diffusion region is electrically connected to the output node BLS0. One diffusion region of the BLSeE transistor is electrically connected to the bit line BLeE, and another diffusion region is electrically connected to the output node BLS0. Also, one diffusion region of the BLSoE transistor is electrically connected to the bit line BLoE, and another diffusion region is electrically connected to the output node BLS1. One diffusion region of the BLSoO transistor is electrically connected to the bit line BLoO, and another diffusion region is electrically connected to the output node BLS1.

Here, as an example in which the odd-numbered group is selected, the BLSeO transistors and the BLSoO transistors are turned on, and the bit line BLeO and the bit line BLoO are connected to the output nodes BLS0 and BLS1, respectively. The BLSeE transistors and the BLSoE transistors are turned off, so as to separate the bit line BLeE and the bit line BLoE from the output node BLS0 and the output node BLS1, respectively.

Furthermore, the bit line selection circuit 100 further includes NMOS-type YBLeO transistors, YBLoE transistors, YBLeE transistors, and YBLoO transistors, for connecting the non-selected bit lines to one of a virtual power supply VIRPWR_0, a virtual power supply VIRPWR_1, and a virtual power supply VIRPWR_2 (the virtual power supply is collectively referred to as VIRPWR). One of the YBLeO transistors, one of the YBLoE transistors, one of the YBLeE transistors, and one of the YBLoO transistors are arranged in series in the column direction in a manner corresponding to the bit lines. To be specific, the YBLeO transistor and the YBLoE transistor are arranged in series between the virtual power supply VIRPWR_0 and the virtual power supply VIRPWR_1; the YBLeE transistor and the YBLoO transistor are arranged in series between the virtual power supply VIRPWR_1 and the virtual power supply VIRPWR_2. The gates of the YBLeO transistors are commonly connected to a selection gate line YBLeO extending in the row direction, the gates of the YBLoE transistors are commonly connected to a selection gate line YBLoE extending in the row direction, the gates of the YBLeE transistors are commonly connected to a selection gate line YBLeE extending in the row direction, the gates of the YBLoO transistors are commonly connected to a selection gate line YBLoO extending in the row direction.

Here, as an example in which the odd-numbered group is selected, the YBLeE transistors and the YBLoE transistors are turned on, and the bit line BLeE and the bit line BLoE are connected to the virtual power supply VIRPWR_1. The YBLeO transistors and the YBLoO transistors are turned off, and the bit line BLeO and the bit line BLoO are separated from the virtual power supply VIRPWR.

Table 3 shows the operating states of the YBLeO transistors, the YBLoE transistors, the YBLeE transistors, and the YBLoO transistors when the odd-numbered group or the even-numbered group is selected. Table 4 shows the operating states of the BLSeO transistors, the BLSeE transistors, the BLSoO transistors, and the BLSoE transistors when the odd-numbered group or the even-numbered group is selected.

TABLE 2

|  | select odd-numbered group | select even-numbered group |
|---|---|---|
| YBLeO | off | on |
| YBLoE | on | off |
| YBLeE | on | off |
| YBLoO | off | on |
| BLeE/BLoE | connected to VIRPWR | non-connected to VIRPWR |
| BLeO/BLoO | non-connected to VIRPWR | connected to VIRPWR |

TABLE 4

|  | select odd-numbered group | select even-numbered group |
|---|---|---|
| BLSeO | on | off |
| BLSeE | off | on |
| BLSoO | on | off |
| BLSoE | off | on |
| BLeE/BLoE | non-connected to BLS | connected to BLS |
| BLeO/BLoO | connected to BLS | non-connected to BLS |

The operations of the YBLeO transistors, the YBLoE transistors, the YBLeE transistors, the YBLoO transistors, the BLSeO transistors, the BLSeE transistors, the BLSoO transistors, and the BLSoE transistors of the bit line selection circuit 100 are respectively controlled by the selection gate line YBLeO, the selection gate line YBLoE, the selection gate line YBLeE, the selection gate line YBLoO, the selection gate line BLSeO, the selection gate line BLSeE, the selection gate line BLSoO, and the selection gate line BLSoE connected to the column selection circuit which is not shown. Moreover, in consideration of layout and the like, the bit line selection circuit 100 is provided with dummy transistors each is between the BLSeO transistor and the YBLoO transistor, or at a position adjacent to the BLSoE transistor. The dummy transistor is normally off.

Figure 6A:
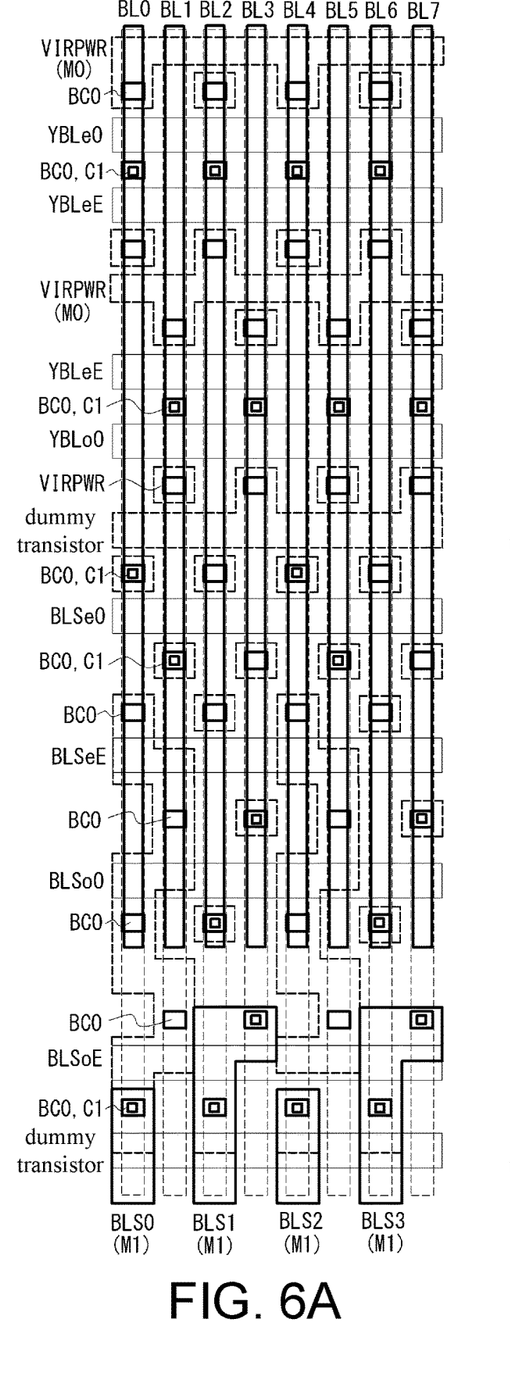
FIG. 6A is a top view of the bit line selection circuit of the first embodiment.
Figure 6B:
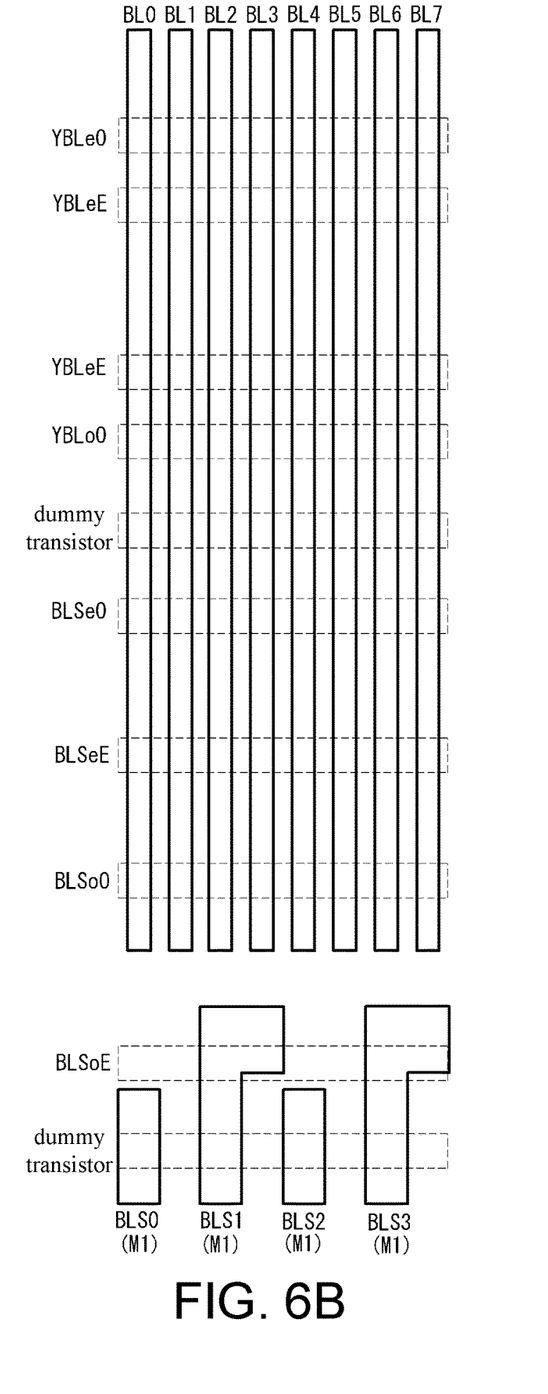
FIG. 6B is a top view of an active area and a polysilicon gate.
Figure 7A:
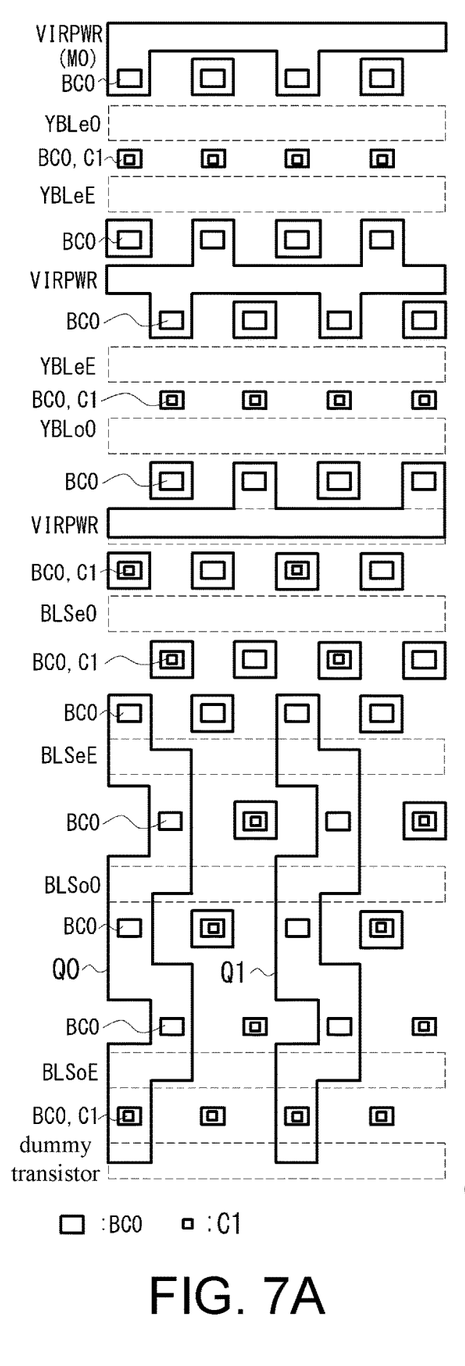
FIG. 7A is a top view illustrating a lower wiring layer M0 of FIG. 6A.
Figure 7B:
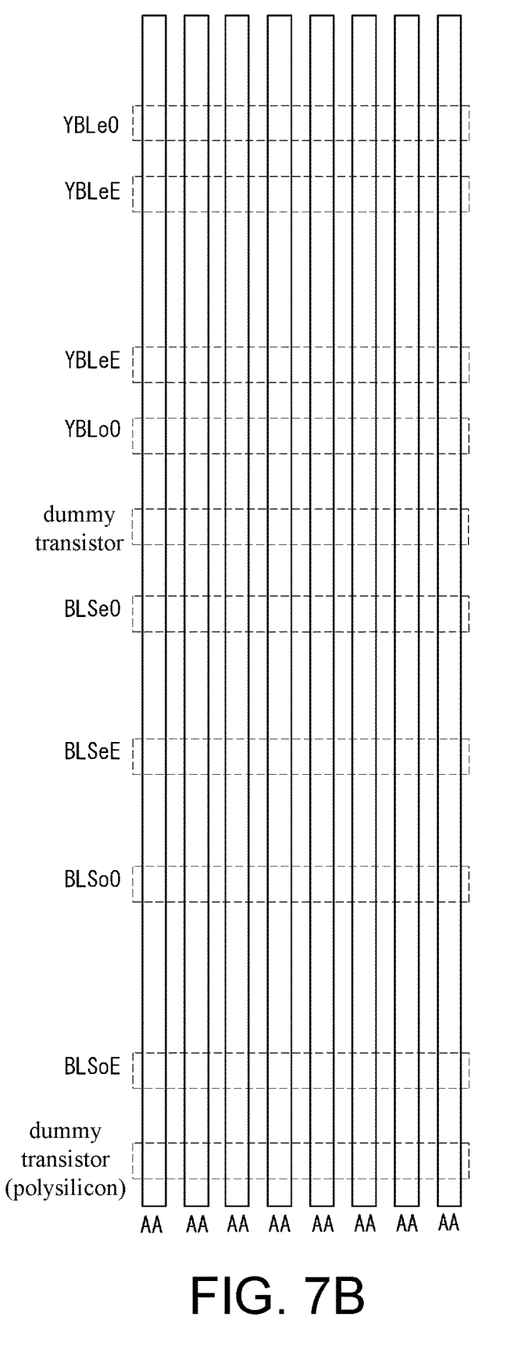
FIG. 7B is a top view illustrating an upper wiring layer M1 of FIG. 6A.
Figure 8:
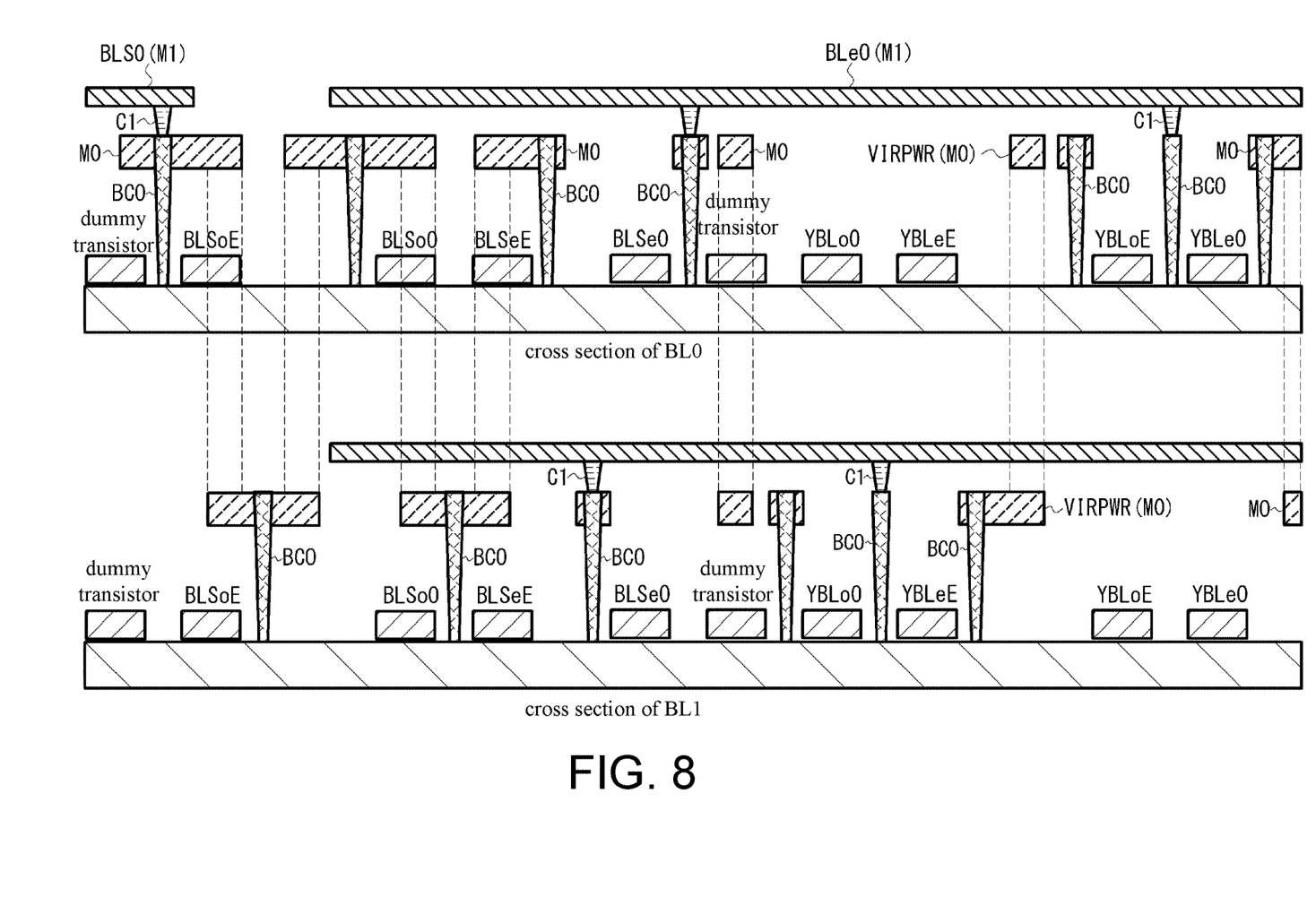
FIG. 8 is a cross-sectional diagram in a direction in which a bit line BL0 extends and a cross-sectional diagram in a direction in which a bit line BL1 extends of FIG. 6A.

FIG. 6A illustrates a top view of a part of the bit line selection circuit of this embodiment, where the bit lines BL0 to BL7 are exemplified. FIG. 6B illustrates the layout of the metal layer M1. FIG. 7A illustrates the layout of the metal layer M0. FIG. 7B illustrates the layout of the diffusion regions and the polysilicon layer. FIG. 8 is a cross-sectional diagram of the bit line BL0 and the bit line BL1 of FIG. 6A in the column direction. BC0 is the contact point between the active area AA and the contact point C1, C1 is the contact point between the contact point BC0 and the bit line BL, and the contact point BC0 and the contact point C1 include conductive materials. The metal layer M0 and the metal layer M1 may also be other conductive materials.

As shown in FIG. 6B, the metal layer M1 forms the bit line BL0 to the bit line BL7 extending in the column direction, and forms electrode patterns of the output node BLS0 to the output node BLS3. The bit line BL0 to the bit line BL7 are electrically connected to the diffusion regions of the corresponding transistors via the contact points C1 and the contact points BC0. The electrode patterns of the output nodes BLS0 and BLS2 extend along the column direction of the bit line BL0 and the bit line BL4, respectively, connected to the lower metal layer M0 via the contact points C1, and are then electrically connected to one of the diffusion regions of the BLSoE transistor via the contact points BC0 under the metal layer M0. The electrode pattern of the output node BLS1 has a L-like shape extending in the column direction of the bit line BL2 and the bit line BL3 and in the row direction between the bit line BL2 and the bit line BL3, and is connected to the diffusion region of the BLSoE transistor of the bit line BL2 and the diffusion region of the BLSoE transistor of the bit line BL3 via the contact points C1 and the contact points BC0. Furthermore, the electrode pattern of the output node BLS3 has a L-like shape extending in the column direction of the bit line BL6 and the bit line BL7 and in the row direction between the bit line BL6 and the bit line BL7, and is connected to the diffusion region of the BLSoE transistor of the bit line BL6 and the diffusion region of the BLSoE transistor of the bit line BL7 via the contact points C1 and the contact points BC0.

As shown in FIG. 7A, the metal layer M0 forms a curved relay electrode pattern Q0 and Q1, where the relay electrode pattern Q0 extends in the column directions of the bit lines BL0 and BL1 and in the row direction between the bit lines BL0 and BL1, and the relay electrode pattern Q1 extends in the column directions of the bit lines BL4 and BL5 and in the row direction between the bit lines BL4 and BL5. The relay electrode pattern Q0 and the relay electrode pattern Q1 are respectively connected to the bit line BL0 and the bit line BL4 via the contact points C1, and are further electrically connected to the corresponding diffusion regions of the transistors via the contact points BC0. The relay electrode pattern Q0 enables the bit line BL0 and the bit line BL1 to be commonly connected to the electrode pattern of the output node BLS0, and the relay electrode pattern Q1 enables the bit line BL4 and the bit line BL5 to be commonly connected to the electrode pattern of the output node BLS2. The metal layer M0 further forms an electrode pattern of the virtual power supply VIRPWR extending in the row direction, and forms a relay electrode pattern between the contact points C1 and the contact points BC0.

As shown in FIG. 7B, the active areas AA are formed in the column directions in a manner corresponding to the bit line BL0 to the bit line BL7. Moreover, gate electrodes of the transistors including the polysilicon layer are formed in the row directions in a manner traversing the active area AA. Furthermore, although the diffusion regions for forming the source/drain of the transistors are not shown herein, the diffusion regions of adjacent transistors in the row direction may be formed collectively.

As shown in FIG. 7A, the contact points BC0 of the BLSeO transistors, the BLSeE transistors, the BLSoO transistors, and BLSoE transistors are formed at 2BL pitch, but the contact points C1 are formed at 4BL pitch on half of the contact points BC0 by the relay electrode patterns Q0 and Q1, so as to simplify the process. In this way, according to this embodiment, by configuring the bit line selection circuit 100 in the memory cell array, the miniaturization and high integration of the flash memory can be realized. Further, each bit line of the selected bit line pair is shielded from the ground potential GND by the adjacent non-selected bit line pair, and the two bit lines of the non-selected bit line pair are interposed between the selected bit line pair and the selected bit line pair, thereby suppressing the read noise and suppressing the effect of the FG coupling of memory cells or coupling between the bit lines.

Next, the bit line selection circuit of a second embodiment of the disclosure will be described. In the first embodiment, the metal layer M0 (i.e. the relay electrode pattern Q0 and the relay electrode pattern Q1) serves as the relay wiring to the bit line. However, the shapes of the relay electrode pattern Q0 and the relay electrode pattern Q1 may vary depending on the connection between the contact points BC0 and the metal layer M0, problems such as short circuit of the relay electrode patterns may occur at fine pitches. Therefore, in the second embodiment, a bit line pair of an even-numbered bit line and an odd-numbered bit line may be selected without using the contact points BC0 for connecting to the metal layer M0.

Figure 9:
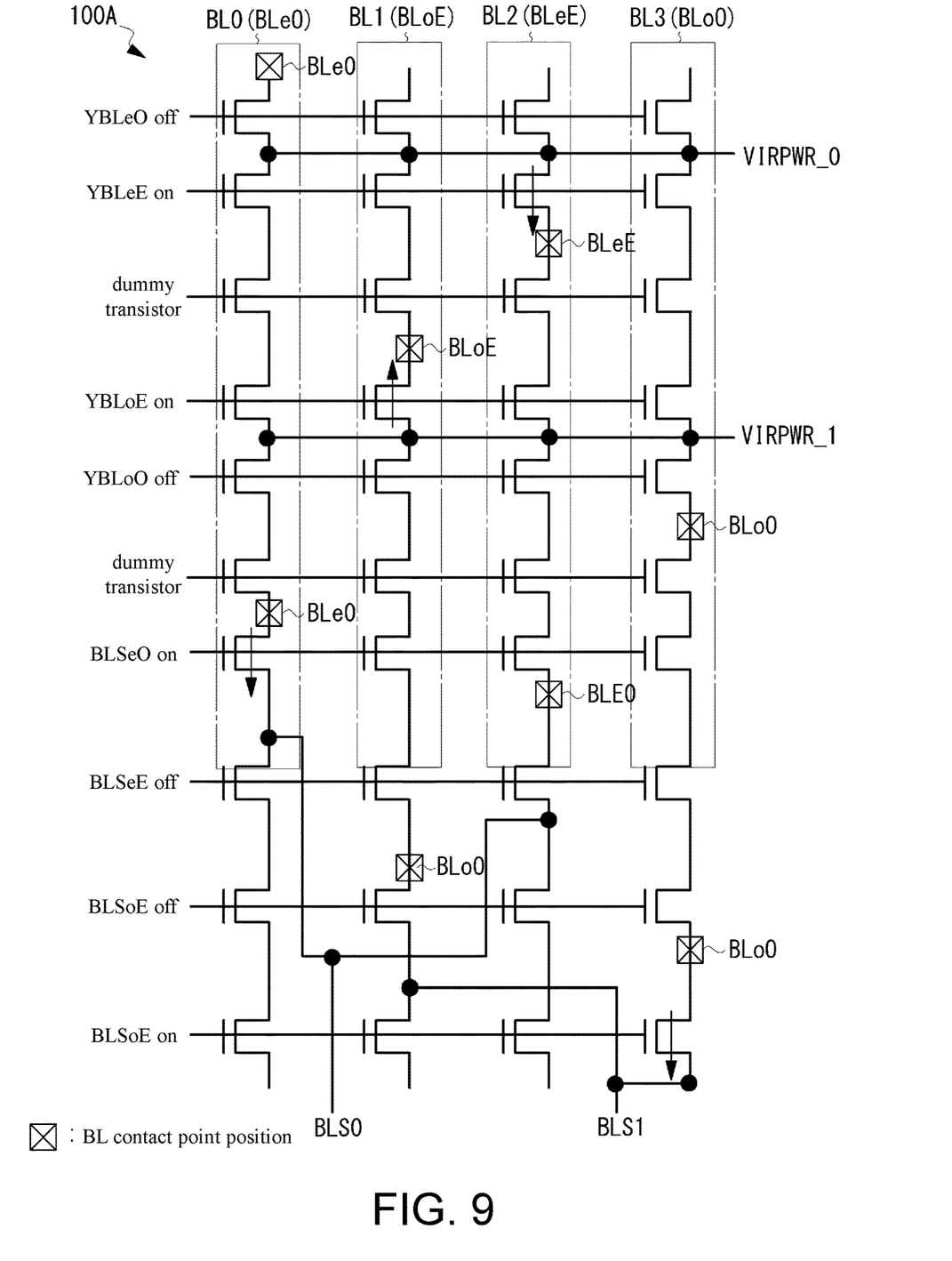
FIG. 9 is a circuit diagram of a bit line selection circuit according to a second embodiment of the disclosure.

FIG. 9 illustrates a part of the bit line selection circuit of the second embodiment, where four bit lines BL0 to BL3 are exemplified. In a bit line selection circuit 100A of the second embodiment, the diffusion regions between the YBLeO transistors and the YBLeE transistors are commonly connected to the virtual power supply VIRPWR_0 extending in the row direction; the bit line BLeO is connected to another diffusion region of the YBLeO transistor; and the bit line BLeE is connected to another diffusion region of the YBLeE transistor. Also, the diffusion regions between the YBLoE transistors and the YBLoO transistors are commonly connected to the virtual power supply VIRPWR_1 extending in the row direction; the bit line BLoE is connected to another diffusion region of the YBLoE transistor; and the bit line BLoO is connected to another diffusion region of the YBLoO transistor. As a result, the number of wirings of the virtual power supply VIRPWR is reduced as compared with the case of the bit line selection circuit 100 of the first embodiment.

Furthermore, the output node BLS0 is shared by the even-numbered bit lines BL0 (BLeO) and BL2 (BLeE), and the output node BLS1 is shared by the odd-numbered bit lines BL1 (BLoE) and BL3 (BLoO). The diagram illustrates the case where the odd-numbered group is selected, in which the bit line BLoE and the bit line BLeE are connected to the virtual power supply VIRPWR_1 and the virtual power supply VIRPWR_0 respectively, the bit line BLeO is connected to the output node BLS0, and the bit line BLoO is connected to the output node BLS1.

Figures 10A, 10B:
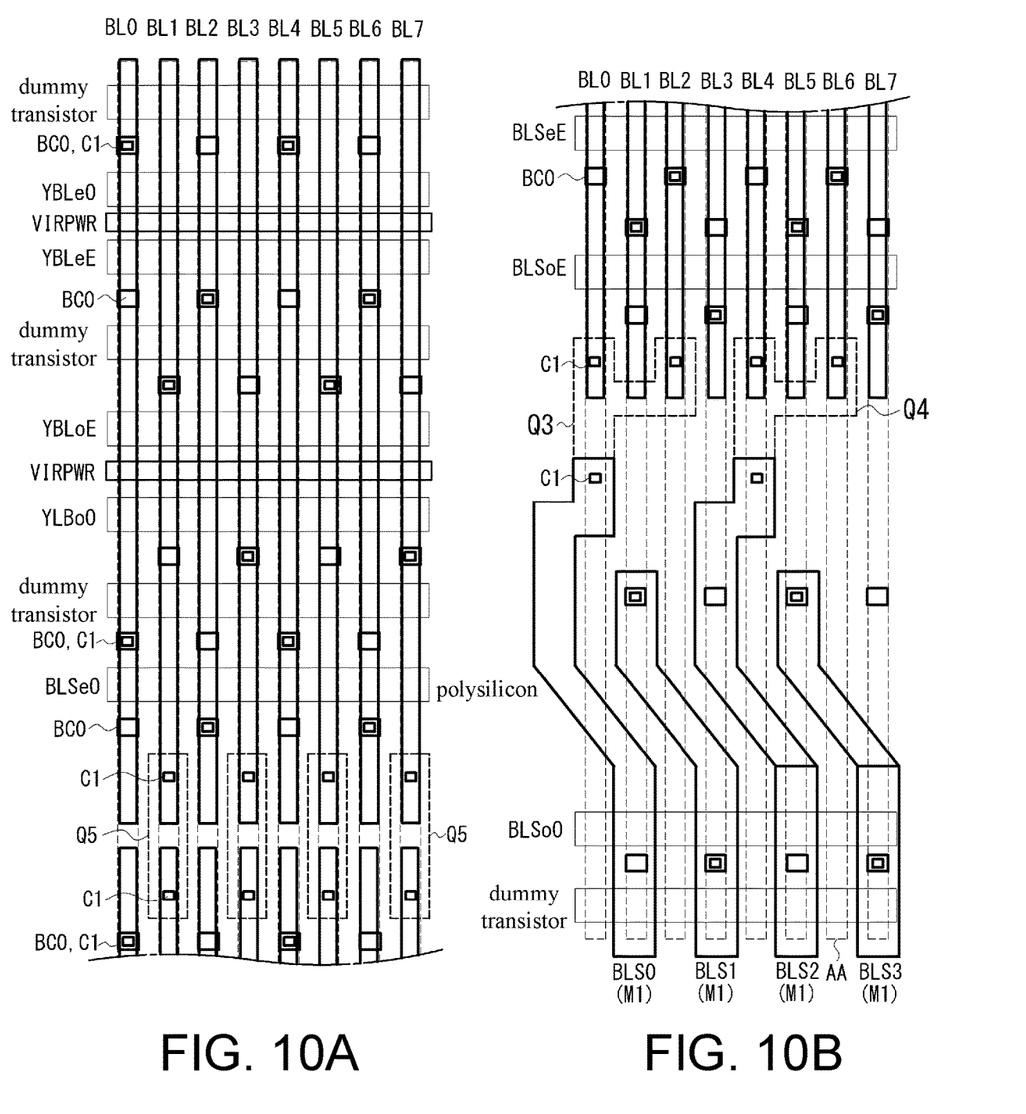
FIGS. 10A and 10B are top views of the bit line selection circuit of the second embodiment.
Figure 11:
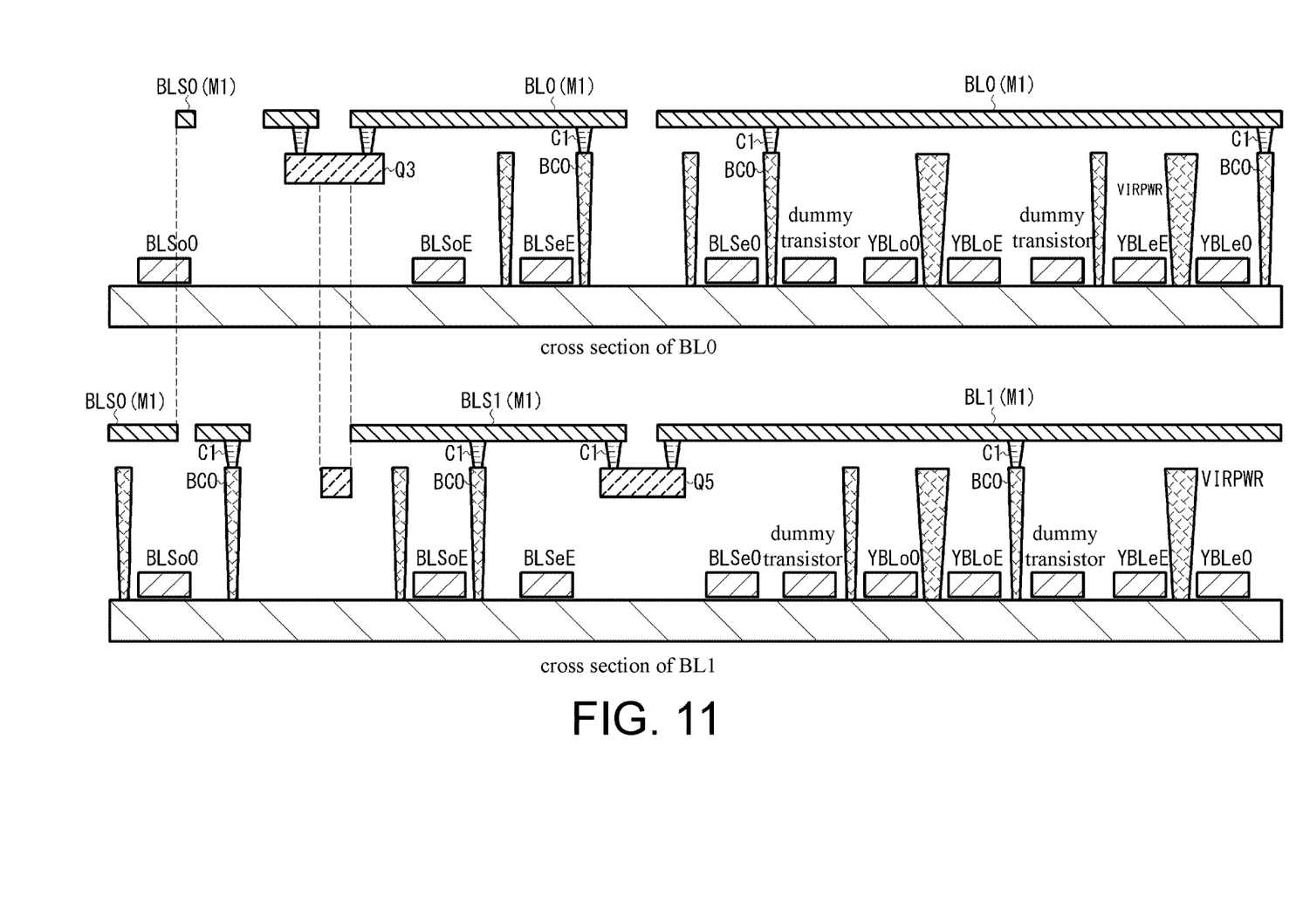
FIG. 11 is a cross-sectional diagram in a direction in which the bit line BL0 extends and a cross-sectional diagram in a direction in which the bit line BL1 extends of FIG. 9.

FIGS. 10A and 10B are top views illustrating the bit line selection circuit of the second embodiment, wherein the bit line BL0 to the bit line BL7 are exemplified. FIG. 11 is a cross-sectional diagram in the column direction of the bit line BL0 and the bit line BL1 of FIGS. 10A and 10B.

As shown in FIGS. 10A and 10B, the metal layer M1 forms the bit line BL0 to the bit line BL7 extending in the column direction, and forms electrode patterns of the output node BLS0 to the output node BLS3. The electrode patterns of the output nodes BLS0 and BLS2 are respectively connected to relay electrode patterns Q3 and Q4 of the metal layer M0 via the contact points C1. The relay electrode pattern Q3 is connected to the bit line BL0 and the bit line BL2 via the contact points C1. The relay electrode pattern Q4 is connected to the bit line BL4 and the bit line BL6 via the contact points C1. The bit line BL0 and the bit line BL4 are connected to one of the diffusion regions of the BLSeO transistors via the contact points C1 and the contact points BC0, and the bit line BL2 and the bit line BL6 are connected to one of the diffusion regions of the BLSeE transistor via the contact points C1 and the contact points BC0.

The electrode pattern of the output node BLS1 is connected to the bit line BL1 and the bit line BL3 via the contact points C1 and the contact points BC0, and the electrode pattern of the output node BLS3 is connected to the bit line BL5 and the bit line BL7 via the contact points C1 and the contact points BC0. The bit line BL1 and the bit line BL5 are connected to one of the diffusion regions of the BLSoE transistor, and the bit line BL3 and the bit line BL7 are connected to one of the diffusion regions of the BLSoO transistor.

The metal layer M0 forms the relay electrode pattern Q3 and the relay electrode pattern Q4 for connecting the electrode patterns of the output nodes BLS0, BLS2 to the even-numbered bit lines BL0, BL2, BL4, BL6, and forms a plurality of relay electrode patterns Q5 for relaying the odd-numbered bit lines BL1, BL3, BL5, BL7, respectively. In the second embodiment, by dividing each of bit lines, a part of the bit line is used as wiring.

With such configuration, there is no connection between the contact points BC0 and the metal layer M0, and short circuit and the like due to the shape change of the relay electrode patterns can be prevented as much as possible.

Figure 12:
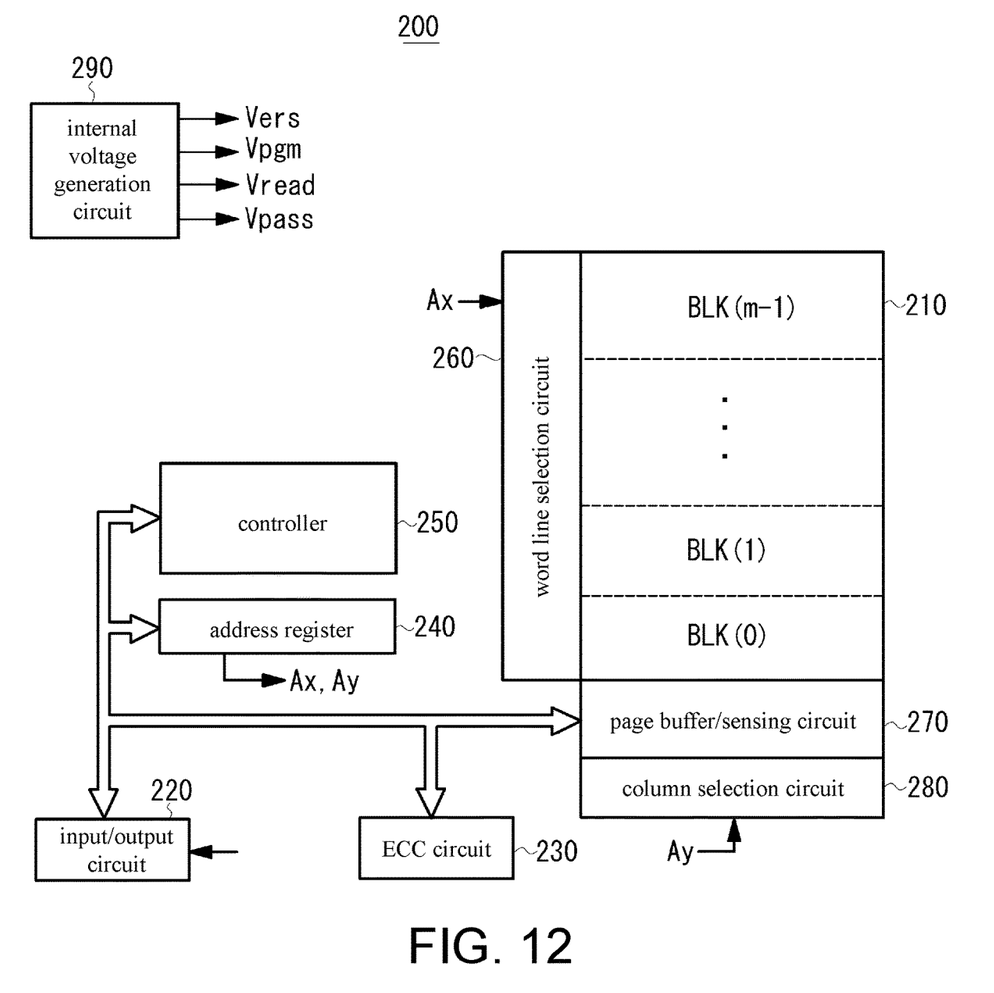
FIG. 12 is a block diagram illustrating a flash memory according to an embodiment of the disclosure.

As shown in FIG. 12, a NAND flash memory 200 of this embodiment includes: a memory cell array 210 including a plurality of memory cells arranged in a matrix and the bit line selection circuit 100 or the bit line selection circuit 100A of the above-mentioned embodiment; an input/output circuit 220 outputting the read data to the outside or importing the data input from the outside; an Error Checking and Correction (ECC) circuit 230 performing error checking and correction of data; an address register 240 receiving address data through the input/output circuit 220; a controller 250 controlling each circuit of the flash memory based on command data received through the input/output circuit 220 or the control signals applied to the terminal; a word line selection circuit 260 performing block selection or word line selection based on row address information Ax outputted from the address register 240; a page buffer/sensing circuit 270 holding data read from the memory cell array 210 or holding programmed data; a column selection circuit 280 performing column selection in the page buffer/sensing circuit 270 or selection of the selection gate lines of the transistors in the bit line selection circuit 100/100A based on the column address information Ay; and an internal voltage generation circuit 290 generating various voltages (a programming voltage Vpgm, a pass voltage Vpass, a reading pass voltage Vread, an erasing voltage Vers, an internal supply voltage VDD, etc.) required for reading, programming, and erasing of data.

The memory cell array 210 has a plurality of memory blocks BLK(0), BLK(1), . . . BLK(m−1). A plurality of NAND strings respectively connected to a plurality of bit lines are formed in one memory block. The memory cell array 210 includes the bit line selection circuit 100/100A, and the bit line selection circuit 100/100A is connected to the bit lines formed at the same pitch as that of the bit lines of the memory cell array. The memory cell may be a single-level cell (SLC) type that stores one bit (binary data), or may be a type that stores multiple bits.

The page buffer/sensing circuit 270 is connected to the bit line pair selected by the bit line selection circuit 100/100A, senses the data read from the selected memory cell, and holds the result in a latch in the page buffer/sensing circuit 270.

The controller 250 controls the operation of the flash memory 200 through a microcontroller or a state machine. In the read operation, a certain positive voltage is applied to the bit line, a certain voltage (i.e. 0 V) is applied to the selected word line; a pass voltage Vpass (i.e. 4.5 V) is applied to the non-selected word line; the bit line side selection transistor and the source line side selection transistor are turned on; and 0 V is applied to the common source line. During the programming operation, a high-voltage programming voltage Vpgm (15 V to 20 V) is applied to the selected word line, and an intermediate potential (e.g. 10 V) is applied to the non-selected word line, such that the bit line side selection transistor is turned on and the source line side selection transistor is turned off, and the potential is supplied to the bit line according to the data of "0" or "1". In the erase operation, 0 V is applied to the selected word line in the memory block, and a high voltage (e.g. 20 V) is applied to a P-well, and the electrons of the floating gate are extracted to the substrate, thereby erasing data in units of blocks.

Finally, it should be noted that the above embodiments are only used to illustrate the technical solution of the disclosure, but not limited thereto. Although the disclosure is described in detail with reference to the above-mentioned embodiments, those skilled in the art should understand that the technical solutions described in the above-mentioned embodiments can still be modified, and some or all of the technical features can be replaced equivalently; such modifications or replacements do not depart from the scope of the technical solutions described by the embodiments of the disclosure.

What is claimed is:

1. A semiconductor storage device, comprising:
a memory cell array, comprising a plurality of NAND strings and a bit line selection circuit, the plurality of NAND strings respectively connected to a plurality of bit lines; and
a page buffer/sensing circuit connected to the bit line selection circuit,
wherein the bit line selection circuit is configured to select a bit line pair composed of an even-numbered bit line and an odd-numbered bit line, in which a bit line pair adjacent to the selected bit line pair is set as a non-selected bit line pair, and the selected bit line pair is connected to the page buffer/sensing circuit via an output node of the bit line selection circuit.

2. The semiconductor storage device according to claim 1, wherein the bit line selection circuit is configured to have a bit line pitch the same as a pitch of the plurality of bit lines.

3. The semiconductor storage device according to claim 1, wherein the plurality of bit lines are divided into a plurality of units, and each unit comprises a first bit line, a second bit line, a third bit line, and a fourth bit line,
the bit line selection circuit comprises a plurality of first transistors, a plurality of second transistors, a plurality of third transistors, and a plurality of fourth transistors for selecting or non-selecting the first bit line, the second bit line, the third bit line, and the fourth bit line, and
one of the plurality of first transistors, one of the plurality of second transistors, one of the plurality of third transistors, and one of the plurality of fourth transistors are arranged in series along a column direction of one of the first bit line, the second bit line, the third bit line, and the fourth bit line; a gate of each of the plurality of first transistors is commonly connected to a first selection gate line extending in a row direction; a gate of each of the plurality of second transistors is commonly connected to a second selection gate line extending in the row direction; a gate of each of the plurality of third transistors is commonly connected to a third selection gate line extending in the row direction; and a gate of each of the plurality of fourth transistors is commonly connected to a fourth selection gate line extending in the row direction.

4. The semiconductor storage device according to claim 3, wherein the bit line selection circuit selects the bit line pair from the first bit line, the second bit line, the third bit line, and the fourth bit line by the first selection gate line, the second selection gate line, the third selection gate line, and the fourth selection gate line, and sets the remaining bit line pair as the non-selected bit line pair.

5. The semiconductor storage device according to claim 1, wherein the output node comprises a first output node and a second output node; and
one bit line of the selected bit line pair and one bit line of the non-selected bit line pair share the first output node, the other bit line of the selected bit line pair and the other bit line of the non-selected bit line pair share the second output node, and the first output node and the second output node are connected to the page buffer/sensing circuit.

6. The semiconductor storage device according to claim 3, further comprising a plurality of first contact points and a plurality of second contact points, wherein
each of the plurality of second contact points is disposed between one of the plurality of first contact points and one of the plurality of bit lines,
one diffusion region of the first transistor is electrically connected to the first bit line through one of the plurality of first contact points and one of the plurality of second contact points,
one diffusion region of the second transistor is electrically connected to the second bit line through one of the plurality of first contact points and one of the plurality of second contact points, and
another diffusion region of the first transistor and another diffusion region of the second transistor is commonly connected to the same output node.

7. The semiconductor storage device according to claim 6, wherein the plurality of first contact points are formed at 2 bit line pitch in the row direction, the plurality of second contact points are formed at 4 bit line pitch in the row direction.

8. The semiconductor storage device according to claim 5, wherein the bit line selection circuit comprises a first electrode pattern forming the first output node, and a second electrode pattern forming the second output node; the first electrode pattern is connected to one bit line of the selected bit line pair and one bit line of the non-selected bit line pair through a first relay electrode pattern; and the second electrode pattern is connected to the other bit line of the selected bit line pair and the other bit line of the non-selected bit line pair through a second relay electrode pattern.

9. The semiconductor storage device according to claim 3, wherein the bit line selection circuit comprises a plurality of fifth transistors, a plurality of sixth transistors, a plurality of seventh transistors, and a plurality of eighth transistors for connecting or non-connecting the first bit line, the second bit line, the third bit line, and the fourth bit line to a virtual power supply, and one of the plurality of fifth transistors, one of the plurality of sixth transistors, one of the plurality of seventh transistors, and one of the plurality of eighth transistors are arranged in series along the column direction of one of the first bit line, the second bit line, the third bit line, and the fourth bit line; a gate of each of the plurality of fifth transistors is commonly connected to a fifth selection gate line extending in the row direction; a gate of each of the plurality of sixth transistors is commonly connected to a sixth selection gate line extending in the row direction; a gate of each of the plurality of seventh transistors is commonly connected to a seventh selection gate line extending in the row direction; and a gate of each of the plurality of eighth transistors is commonly connected to an eighth selection gate line extending in the row direction.

10. The semiconductor storage device according to claim 9, wherein the bit line selection circuit connects the non-selected bit line pair to the virtual power supply through the fifth selection gate line, the sixth selection gate line, the seventh selection gate line, and the eighth selection gate line.

11. The semiconductor storage device according to claim 1, wherein, the page buffer/sensing circuit detects a current flowing in a bit line of the selected bit line during a read operation.

12. The semiconductor storage device according to claim 3, further comprising a plurality of first contact points and a plurality of second contact points, wherein
each of the plurality of second contact points is disposed between one of the plurality of first contact points and one of the plurality of bit lines,
one diffusion region of the first transistor is electrically connected to the first bit line,
one diffusion region of the second transistor is electrically connected to the second bit line,
the output node comprises a first output node and a second output node,
another diffusion region of the first transistor and another diffusion region of the second transistor is connected to the first output node and the second output node, respectively.

13. The semiconductor storage device according to claim 7,
wherein half of the plurality of first contact points are connected to a first relay electrode pattern under the plurality of bit lines and not connected to the second contact points.

14. The semiconductor storage device according to claim 12, wherein
the electrode pattern of the first output node is connected to a first relay electrode pattern under the plurality of bit lines through the second contact point,
the first relay electrode pattern is connected to the first bit line and the third bit line via the second contact points,
each of the plurality of bit lines are divided in at least two parts and connected by a second relay electrode pattern under the plurality of bit lines,
the second relay electrode pattern is connected to the first bit line and the second bit line through the second contact points.

* * * * *